United States Patent
Gao

(10) Patent No.: US 9,257,811 B2
(45) Date of Patent: Feb. 9, 2016

(54) BROAD BAND CONTINUOUS TUNABLE LASER

(71) Applicant: GP Photonics, Inc., Tianjin (CN)

(72) Inventor: Peiliang Gao, Victoria (CA)

(73) Assignee: GP PHOTONICS, INC. (CN)

( * ) Notice: Subject to any disclaimer, the term of this patent is extended or adjusted under 35 U.S.C. 154(b) by 0 days.

(21) Appl. No.: 14/339,605

(22) Filed: Jul. 24, 2014

(65) Prior Publication Data

US 2015/0003487 A1 Jan. 1, 2015

Related U.S. Application Data

(63) Continuation of application No. PCT/CN2012/078332, filed on Jul. 9, 2012.

(30) Foreign Application Priority Data

Jun. 18, 2012 (CN) .......................... 2012 1 0200447

(51) Int. Cl.
*H01S 3/08* (2006.01)
*H01S 3/106* (2006.01)
*H01S 3/11* (2006.01)

(52) U.S. Cl.
CPC .............. *H01S 3/1062* (2013.01); *H01S 3/1068* (2013.01); *H01S 3/08* (2013.01); *H01S 3/1065* (2013.01); *H01S 3/1109* (2013.01)

(58) Field of Classification Search
CPC ... H01S 5/141; H01S 5/02284; H01S 5/0617; H01S 5/0687; H01S 5/142; H01S 3/0057; H01S 3/0675; H01S 3/08; H01S 3/08059
USPC ........................................................ 372/107
See application file for complete search history.

(56) References Cited

U.S. PATENT DOCUMENTS 5,321,539 A * 6/1994 Hirabayashi et al. .......... 349/198
6,930,819 B2 * 8/2005 Chu et al. ...................... 359/310

* cited by examiner

*Primary Examiner* — Xinning Niu
*Assistant Examiner* — Vu A Vu
(74) *Attorney, Agent, or Firm* — Zareefa B. Flener; Flener IP Law

(57) ABSTRACT

The invention relates to a broad band continuous tunable laser. The laser includes a first laser cavity mirror, a laser gain medium, an intracavity collimating lens, an active optical phase modulator, a tunable acousto-optic filter, and the tunable laser further includes an intracavity reflection mirror to reflect the first order diffracted beam of the first diffraction back to the tunable acousto-optic filter to compensate the wavelength shift, a tunable Fabry-Perot filter arranged in the optical path of the second diffraction beam, a second laser cavity mirror and a laser drive and control circuit system. A stable laser output and the precision optical frequency tuning for less than 1 GHz frequency accuracy within a wide spectrum range can be realized. The invention is compact with stable performance, low cost for volume production and easy installation without moving parts.

11 Claims, 7 Drawing Sheets

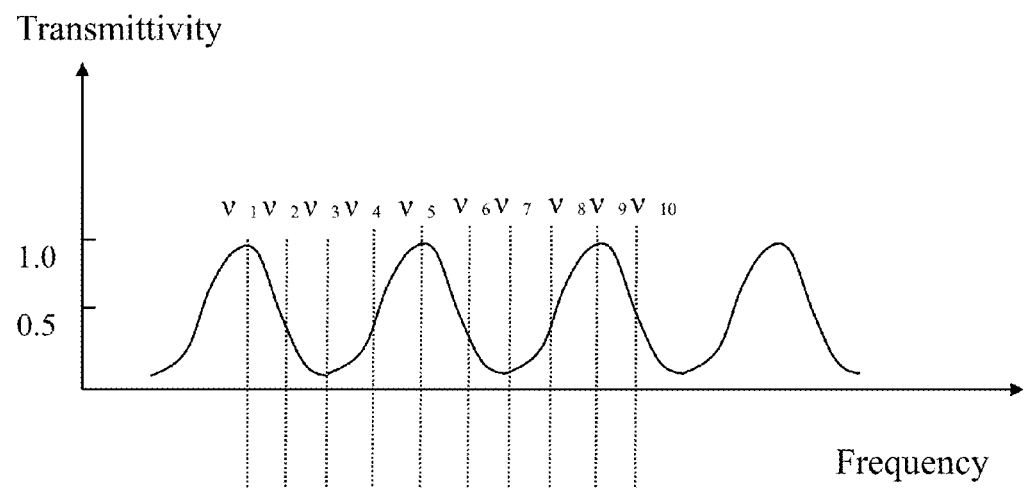
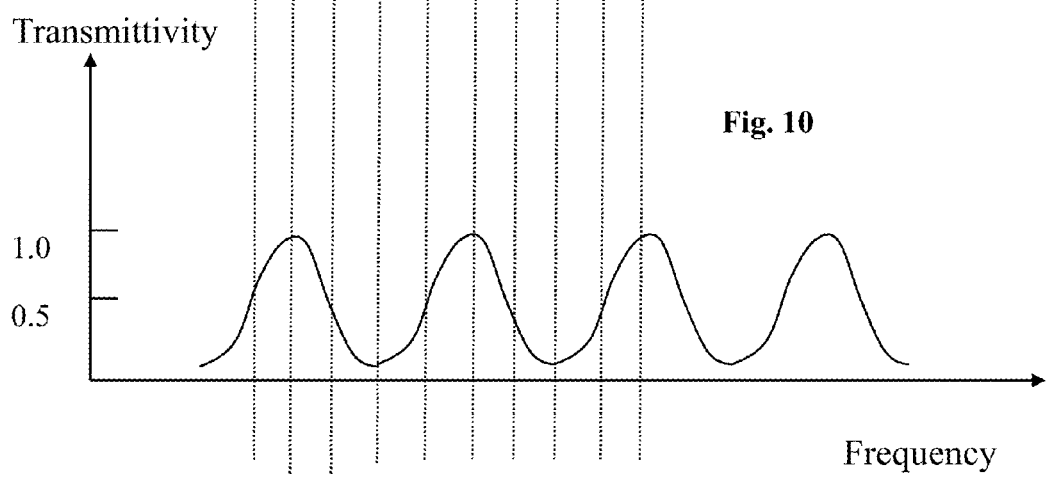
Fig. 10
Fig. 11

BROAD BAND CONTINUOUS TUNABLE LASER

The application is a continuation of PCT/CN2012/078332 (filed on Jul. 9, 2012), which claims priority of Chinese patent application 201210200447.4 (filed on Jun. 18, 2012), the contents of which are incorporated herein by reference.

FIELD OF THE INVENTION

1. Field of the Invention

The invention belongs to the field of photonics, and in particular relates to a broad band continuous tunable laser using tunable Fabry-Perot filter and tunable acusto-optic filter.

2. Background of the Invention

There are typically three tuning technologies used in an external cavity tunable laser: 1) tuning is achieved by using a precision stepping motor to drive a grating to rotate. This technology has the following shortcomings: first, there are quite high requirements on stepping moving precision and repeatability of the stepping motor in achieving broad band continuous tuning, thus the cost is relatively high; second, the purpose of miniaturization is hardly achieved due to the stepping motor used; and third, the operational stability is poor under a harsh working environment, in particular, the resistance to various mechanical vibrations is poor. Because of these problems, the tunable laser using this technology is only suitable for use under a laboratory working environment, 2) tuning is achieved by a tunable acousto-optic filter. This technology has the advantages of high tuning speed, no mechanical moving component and small size. However, it has the shortcomings of low tuning precision and relatively wide filtering bandwidth, therefore, the tunable laser using this technology is only suitable for applications in which both the tuning precision and the output bandwidth are not high, 3) tuning is based upon the temperature-sensitive characteristics of an optical filter such as grating or other optical filtering devices in laser resonant cavity, such as an optical Etalon. This tuning technology has high tuning precision and relatively narrow spectrum bandwidth, but low tuning speed. Therefore it is not suitable when the wide spectral range tuning is needed, for example: if the temperature coefficient of an optical filtering device is 0.02 nanometers/degree, the desired spectrum range and temperature adjustment range are 20 nanometers and 100 degrees respectively, which is impracticable for some applications.

SUMMARY OF THE INVENTION

It is an objective of the invention to overcome the shortcomings in the prior art and to provide a broad hand continuous tunable laser with stable performance, low cost, small size, easy installation and mass production.

The technical scheme below is adopted by the invention for solving the technical problems in the prior art:

A broad band continuous tunable laser comprising a first laser cavity mirror, a laser gain medium, an intracavity collimating lens, an active optical phase modulator, a tunable acousto-optic filter, an intracavity reflection mirror, a tunable Fabry-Perot filter, a second laser cavity mirror and a laser drive and control circuit system; the tunable Fabry-Perot filter includes a first reflection mirror, a liquid crystal module, and a second reflection mirror; the first reflection mirror, and the second reflection mirror forms a Fabry-Perot cavity, the liquid crystal module is arranged inside the Fabry-Perot cavity; the intracavity collimating lens collimates the light beam outputted from the laser gain medium and inputs the collimated beam into the tunable acousto-optical filter at Bragg angle to generate the first diffraction after passing through the active optical phase modulator; the intracavity mirror is arranged on the opposite side of the acousto-optic filter from the laser gain medium to reflect the first order diffracted beam of the first diffraction by the tunable acousto-optic filter at the Bragg angle back to the tunable acousto-optic filter for second diffraction to compensate the optical frequency shift caused by the first diffraction; the tunable Fabry-Perot filter is arranged on the opposite side of the acousto-optic filter from the intracavity reflection mirror and in the optical path of the first order diffracted beam of the second diffraction by the tunable acousto-optic filter, the second laser cavity mirror is arranged on the opposite side of the acousto-optic filter from the intracavity reflection mirror and behind the tunable Fabry-Perot filter; the first laser cavity mirror, the intracavity reflection mirror and the second laser cavity mirror forms the laser cavity; the first laser cavity mirror, the laser gain medium, the intracavity collimating lens, the active optical phase modulator, the tunable acousto-optical filter, the intracavity reflection mirror, the tunable Fabry-Perot filter and the second laser cavity mirror are arranged in such a way that only the first order diffracted beams of the first diffraction and the second diffraction can be oscillated in the laser cavity; the laser output beam is in the same optical axis of the first order diffracted beam of the first diffraction.

Further, the first laser cavity mirror, the second laser cavity mirror and the intracavity reflection mirror are one of the following types of reflection mirrors: plane mirror, convex mirror and concave mirror with equal to or less than 100% reflectivity, and have the same spectrum range as the laser gain medium; the first laser cavity mirror can be a multilayer dielectric thin film coated directed on the laser gain medium; the intracavity reflection mirror can be reflective optical grating or other optical dispersive mirror.

Further, the laser gain medium is a broad band laser gain medium.

Further, the active optical phase modulator is one of the following types: opto-electric, acusto-optic, and opto-magnatic optical phase modulator or the combination of the above optical phase modulators.

Further, the tunable acousto-optic filter includes a single acousto-optic crystal, a single acoustic wave transducer bonded on a selected surface of the acousto-optic crystal and a radio frequency signal source.

Further, the out surface of the first reflection mirror is coated with high reflection thin film; internal surface of the first reflection mirror is coated with anti-reflection thin film and transparent electrode; the internal surface of the second reflection mirror is coated with transparent electrode and anti-reflection thin film; out surface of the second reflection mirror is coated with high reflection thin film.

Further, the liquid crystal is nematic type, and the thickness of the liquid crystal layer is from a few urn to thicker than 10 um, and exhibits more than $2\pi$ optical phase change for a polarized light beam with certain orientation by an external electric signal, and has the same spectrum range as the laser gain medium.

Further, the broad band continuous tunable laser comprising a laser frequency and oscillation mode locking device, wherein the laser frequency and oscillation mode locking device comprises a first Fabry-Perot etalon, a first photo detector, a second Fabry-Perot etalon and a second photo detector; the first Fabry-Perot etalon is arranged outside of the laser cavity and in the optical path of the zero-order diffracted light beam of the second diffraction by the acousto-optic filter; the first photo detector is arranged behind the first Fabry-Perot etalon to detect the light beam power transmitted from the first Fabry-Perot etalon; the second Fabry-Perot etalon is arranged outside the laser cavity and in the optical path of zero-order diffracted light beam of the light beam reflected by the second laser cavity mirror and diffracted by the acousto-optical tunable filter; the second photo detector is arranged behind the second Fabry-Perot etalon to detect the light beam power transmitted from the second Fabry-Perot etalon.

Further, the first Fabry-Perot etalon has the same optical spectrum range as the laser gain medium; the maximum and minimum transmitted optical power difference of the first Fabry-Perot etalon is equal to or larger than 3 dB by setting up the proper finesse; the free spectrum range of the first Fabry-Perot etalon is four time that of the tunable Fabry-Perot filter without external electric voltage; one of the transmission frequency peak of the Fabry-Perot etalon is the same as that of the tunable Fabry-Perot filter.

Further, the second Fabry-Perot etalon has the same optical spectrum range as the laser gain medium, and same finesse and free spectrum range as that of the first Fabry-Perot etalon; the difference of the transmission frequency peak between the first and second Fabry-Perot etalon is equal to the free spectrum range of the tunable Fabry-Perot filter without external electric voltage.

Further, the broad band continuous tunable laser comprising a laser power locking device, wherein the laser power locking device comprises a photo detector arranged outside the laser cavity and in the optical path of zero-order diffracted light beam of the second diffraction of the light beam reflected by the second laser cavity mirror and diffracted by the acousto-optic filter.

Further, the laser drive and control circuit system includes a digital signal processor with embedded software program, a laser pumping source, an active optical phase modulator drive source, a radio frequency signal source for the tunable acousto-optic filter, a driving source for the tunable Fabry-Perot filter, two analog-to-digital conversion devices, four digital-to-analog conversion devices and a temperature control device, the digital signal processor with embedded software programs is used for controlling the laser pumping source, the active optical phase modulator drive source, the radio frequency signal source, and the driving source for the tunable Fabry-Perot filter through the digital-to-analog conversion devices; the digital signal processor with embedded software programs is also used to drive and control the temperature control device, and drive and control the laser optical frequency and mode locking device and the laser optical power locking, devices through the analog-to-digital conversion devices the digital signal processor may also receive an external instruction to control the broad hand continuous tunable laser for all operation related functions.

The Invention has the Following Advantages and Positive Effects

1. In the invention, a tunable Fabry-Perot filter is designed by putting a thin layer (about 10 um) of liquid crystal into a Fabry-Perot cavity to form a tunable Fabry-Perot filter, and the combination of the tunable Fabry-Perot tunable filter and a narrow band tunable acousto-optic filter is used to lower the requirement of narrow filter bandwidth of an acusto-optic filter and to achieve fast and accurate laser tuning, with narrow output bandwidth within a wide spectrum range.

2. A wavelength shift of the diffracted beam by the acousto-optic filter is compensated by using an intracavity mirror to generate a second diffraction with an opposite wavelength shift to achieve more stable laser output, and different types of the laser cavity mirrors can be used to form different types of the laser cavity according to the different types of the laser gain media and different applications. The laser cavity loss can be adjusted by changing the distance between the intracavity mirror and the tunable acusto-optic filter.

3. The laser mode and frequency can be monitored and locked by using three zero order diffracted beams leaked outside of the laser cavity without the need to use additional components inside laser cavity to improve the laser performance and lower the cost.

4. The invention provides a method to build a tunable laser with no mechanical moving component to achieve fast and accurate laser tuning with stable and narrow output bandwidth of less than 1 GHz within a wide spectrum range, and low cost, compact size, easy installation and mass production, and can meet the requirement for small size and reliable operation under an extreme working environment. Furthermore, the invention can also be widely used in optical test, fiber optical communication, biology, medical instrument, fiber sensor network and other fields.

BRIEF DESCRIPTION OF THE DRAWINGS

FIG. 3-1 is a wave vector relation diagram of the incident light beam, the first diffracted beam, and the acoustic wave field in the acousto-optic crystal:

FIG. 3-2 is a wave vector relation diagram of the incident light beam, the second diffracted beam, and the acoustic wave field in the acousto-optic crystal;

FIG. 10 is a schematic diagram of the transmission spectrum of the first Fabry-Perot etalons for laser optical frequency and mode locking;

FIG. 11 is a schematic diagram of the transmission spectrum of the second Fabry-Perot etalons for laser optical frequency and mode locking;

DETAILED DESCRIPTION OF THE INVENTION

Further detailed description is made below to the embodiments of the invention with reference to the drawings.

Figure 1:
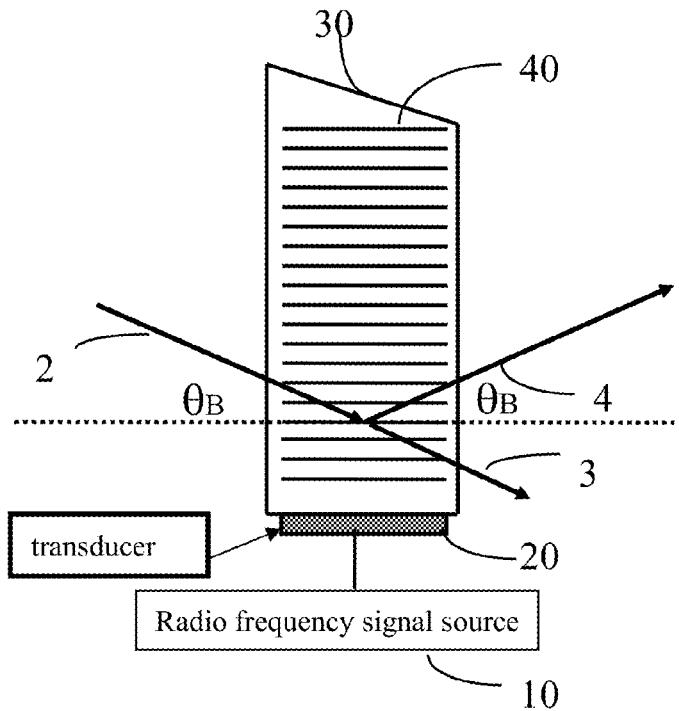
FIG. 1 is a schematic diagram of a conventional tunable acousto-optic filter.

FIG. 1 illustrates an existing conventional tunable acousto-optic filter. The tunable acousto-optic filter has a single transducer. An incident light beam 2 enters the acousto-optic crystal 30 at Bragg angle to generate a zero-order diffraction light beam 3 and a first-order diffraction light beam 4.

Figures 1, 3:
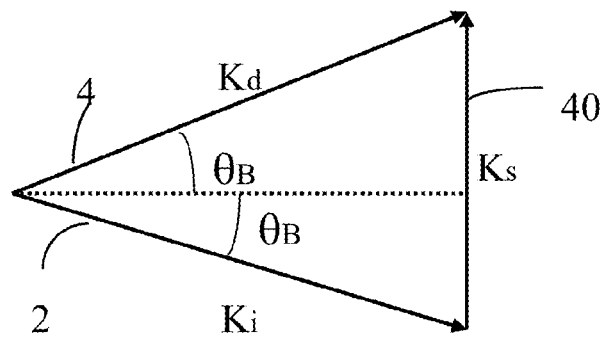
Figures 2, 3:
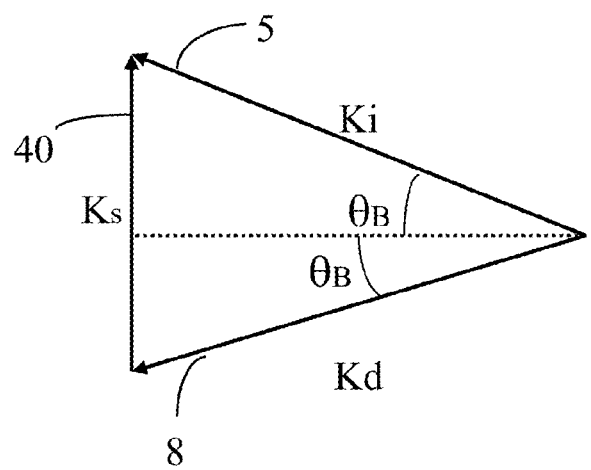

The principle of the acousto-optic filter is based upon a phenomenon known as Bragg diffraction that involves the interaction process of photons (light energy's quanta) and phonons (acoustic energy's quanta). Both energy and momentum are conserved in this interaction process. $h\kappa_d=h\kappa_i+h\kappa_s$ is required in momentum conservation, wherein $h\kappa_d$ is the momentum of diffraction photon, $h\kappa_i$ is the momentum of incident photon and $h\kappa_s$ is the momentum of interactive phonon. The formula below is obtained after h is removed: $\kappa_d=\kappa_i+\kappa_s$, which is the fundamental wave vector equation in Bragg diffraction and means that the diffracted light wave vector is the vector sum of the incident light wave vector and the acoustic wave vector, as shown in FIG. 3-1.

The relation of $(h\omega_r=h\omega+h\Omega)$ is required in energy conservation, wherein $\omega_r$ is the angular frequency of diffracted light, $\omega$ is the angular frequency of incident light and $\Omega$ is the angular frequency of acoustic wave. The formula below is obtained after h is removed: $\omega_r+\omega+\Omega$. This means that the angular frequency of diffraction photon is slightly altered by the angular frequency of the acoustic wave, or so called Doppler frequency shift.

Acousto-optic Tunable Filter (AOTF) is a solid-state bandpass optical filter that can be tuned by an electric signal. Compared with the traditional techniques, AOTF provides continuous and fast tuning capability with narrow spectrum bandwidth. Acousto-optic filters can be divided in two categories: collinear and non-collinear. Narrow-band filtering can be realized by a non-collinear and far off-axis type filter. From the formula $\omega_r=\omega+\Omega$, it is known that the magnitude of the Frequency shift of the diffracted light wave is equal to the frequency of acoustic wave.

While Doppler frequency shift in AOTF is small because acoustic wave frequency is of many orders of magnitude smaller compared with the light wave frequency, unstable operation can still arise in some laser systems. One solution to solve this problem is the use of two AOTFs in which the second AOTF is used for compensating the frequency shift caused by the first AOTF. Another solution is the use of two transducers on a single acousto-optic crystal. But these solutions have a few shortcomings such as: 1), the increase of system size and electric power consumption, 2), more difficult for optical alignment, 3), unstable operation, and 4), cost increase, which is especially important for mass production.

Figure 2:
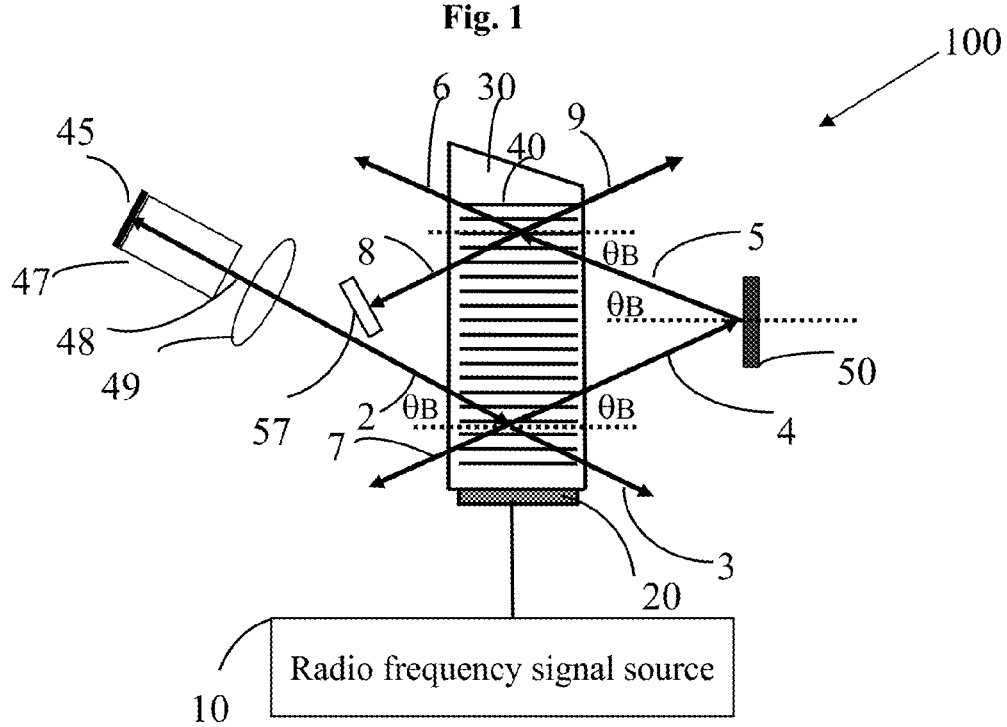
FIG. 2 is a schematic diagram of a tunable laser 100 using an acousto-optic filter.

FIG. 2 illustrates a schematic diagram of a tunable laser 100 using a tunable acousto-optic filter as shown in FIG. 1. The reflection mirror 45, 50 and 57 forms the laser cavity. The laser gain medium 47 emits a broad band light 48, which is collimated by the intracavity collimating lens 49 to a collimated light beam 2. The collimated light beam 2 enters the acousto-optic crystal 30 at Bragg angle to generate a zero-order diffraction light beam 3 and a first-order diffracted light beam 4. The light beam 4 is reflected by the mirror 50 and re-enters the acousto-optic crystal 30 at Bragg angle, and diffracted again into zero-order diffracted light beam 6 and first order diffracted light beam 8, which is reflected by the laser cavity mirror 57 back to the laser cavity to be oscillated and amplified inside the laser cavity. In this process, light beam 3 has the maximum energy and zero frequency shift, and therefore can be used as the laser output. Other zero order light beam 6, 7 and 9 leaks out of the laser cavity, and can be used for monitoring the laser power and wavelength to avoid inserting other components into the laser cavity for such purposes. The reflection mirror 45, 50 and 57 can be total reflection mirrors with 100% reflectivity to reduce the laser cavity loss. The tunable laser 100 is compact using an acousto-optic filter with a single acousto-optic crystal and a single transducer and capable of eliminating frequency shift caused by the acousto-optic filter during the laser oscillation. The incident light beam 2 enters the acousto-optic crystal 30 at Bragg angle to generate a zero-order diffracted light beam 3 and a first-order diffracted light beam 4, which is diffracted again by acousto-optic crystal 30 into a zero-order diffracted light beam 6 and a first-order diffracted light beam 8 after being reflected by the reflection mirror 50. The transducer is connected to the radio frequency signal source 10, which is used to provide the radio frequency electric energy to drive the acousto-optic filter and to tune the laser cavity oscillation wavelength.

FIG. 3-1 and FIG. 3-2 illustrate the wave vector relation among the incident light ($\kappa_i$), the diffracted light ($\kappa_d$) and the acoustic wave ($\kappa_s$). As mentioned above, the relation $\kappa_i\pm\kappa_s=\kappa_d$ is always true, whether plus sign (+) or minus sign (−) is used is determined by the direction of incident acoustic wave with respect to that of the acoustic waves. In FIG. 3-1, light beam 2 ($\kappa_2$), light beam 4 ($\kappa_4$) and acoustic wave 40 ($\kappa_s$) have such a relation that: $\kappa_2+\kappa_s=\kappa_4$. The acoustic wave $K_s$ leads to not only upward shift of the diffracted light, but also upward shift of the angular frequency $\omega$ of the light by $\Omega=v_s|\kappa_s|$, wherein $v_s$ is the velocity of acoustic wave. In FIG. 3-2, the light beam 8 ($\kappa_8$), the light beam 5 ($\kappa_5$) and the acoustic wave 40 ($K_s$) have such a relation that: $\kappa_5-\kappa_s=\kappa_8$. In this case, acoustic wave leads to downward shift and also downward shift of the angular frequency $\omega$ of the light beam 5 diffracted by $v_s|\kappa_s|$. The upward and downward shifts are basically the same, so the overall frequency shift is fully eliminated.

In some embodiments, for example, when narrow-band tuning is needed, an anisotropic and birefringent acousto-optic crystal is used. One of the crystals is tellurium dioxide ($TeO_2$), which is widely used in such applications because it has high optical uniformity, low light absorbancy and high damage threshold to optical power when operating under a shear mode. Other crystals such as lithium niobate ($LiNbO_3$), gallium phosphide (GaP) and lead molybdate ($PbMoO_4$) are also frequently used in a variety of acousto-optic sources. There are several factors that influence the choice of a particular crystal such as the type of acousto-optic source, whether high-quality crystal is easily available and the requirements of a particular application, such as diffraction efficiency, power loss, degree of dispersion of the incident light and the diffracted light and overall source size, etc.

Figure 4:
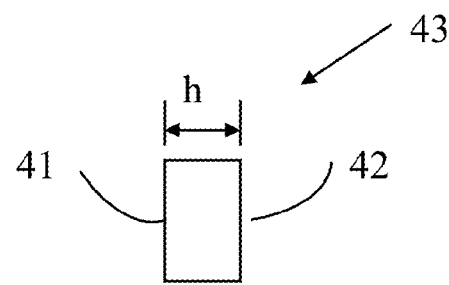
FIG. 4 is a schematic drawing of a conventional Fabry-Perot etalon.
Figure 7:
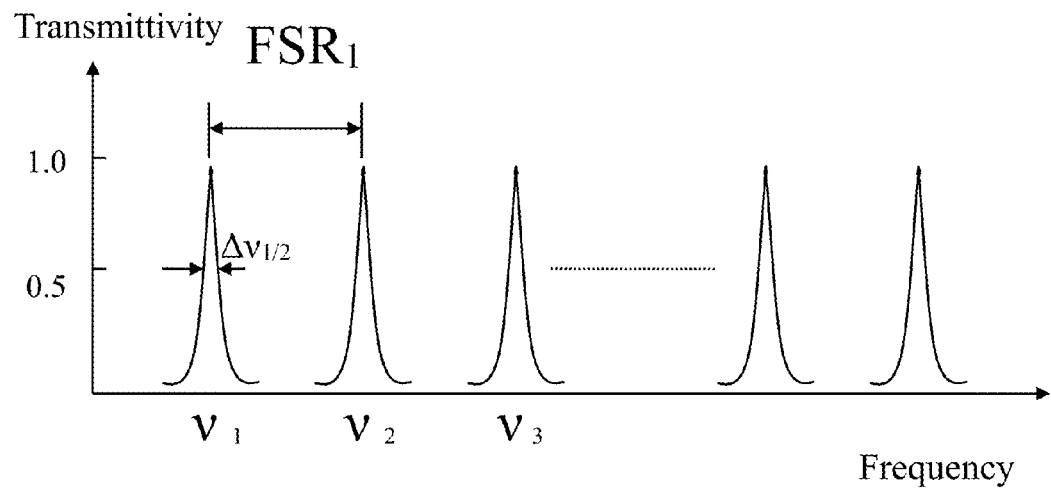
FIG. 7 is a schematic drawing of the output optical spectrum of a conventional Fabry-Perot etalon.

FIG. 4 illustrates a conventional Fabry-Perot etalon 43. For the etalon applications in visible or infrared optical wavelength spectrum, the optical materials such as BK7 or fused silica are usually used. Assuming that the refractive index of the material is n, the optical surface 41 and 42 are coated with reflective thin film of high reflectivity R, the thickness is h, and optical beam enters the etalon at approximately zero degree, the free spectrum range ($FSR_1$) of the etalon 43 can be expressed as: $\Delta\lambda=\lambda^2/(2nh)$, or $\Delta v=c/(2nh)$, where c is the speed of light. The transmission peak can be calculated by $v=mc/(2nh)$, where m is the order of interference, the spectrum width (full width half maximum or FWHM) of the transmission can be calculated by $FWHM=c(1-R)/(2nh R^{1/2})$, where c is the speed of light. From the above formula, the free spectrum range (FSR) of etalon 43 is inversely proportional to the thickness h, i.e. the higher the $FSR_1$, the thinner of h. Assuming n=1.5, and the required $FSR_1$=100 GHz, then h is approximately equals to 1 mm. When the materials of etalon and the thickness is fixed, the transmission spectrum or the finesse is mainly affected by the reflectivity R, the higher the reflectivity R, the narrower the transmission spectrum bandwidth. The Fabry-Perot etalon can achieve very narrow spectrum output and multiple frequency peaks with equal frequency interval in the very wide spectrum range, as illustrated in FIG. 7.

For applications in the fiber optic telecommunication, tunable lasers are required to provide very narrow bandwidth, and therefore high finesse etalon is usually required.

The liquid crystal used in the photonics fields usually exhibit significant anisotropic orientational structure, and have high resistivity, and therefore can be considered as ideal dielectric material. Most nematic liquid crystals are uniaxial: they have one axis that is longer and preferred. Aligned nematic have the optical properties of uniaxial crystals, and they can be easily aligned by an external electric field. When an external electric field is applied to the liquid crystal, the dipole molecules tend to orient themselves along the direction of the field. The optical axis of the liquid crystal can be changed by changing the intensity of the external electric field. The liquid crystals are widely used in optical phase modulator, tunable filter, and other photonics devices, such as optical switch and power modulator, etc. The thickness of the liquid crystal layer used in these applications are typically about 10 um. The tunable Fabry-Perot filter in this invention has been built based upon the optical properties of the liquid crystals.

Figure 5:
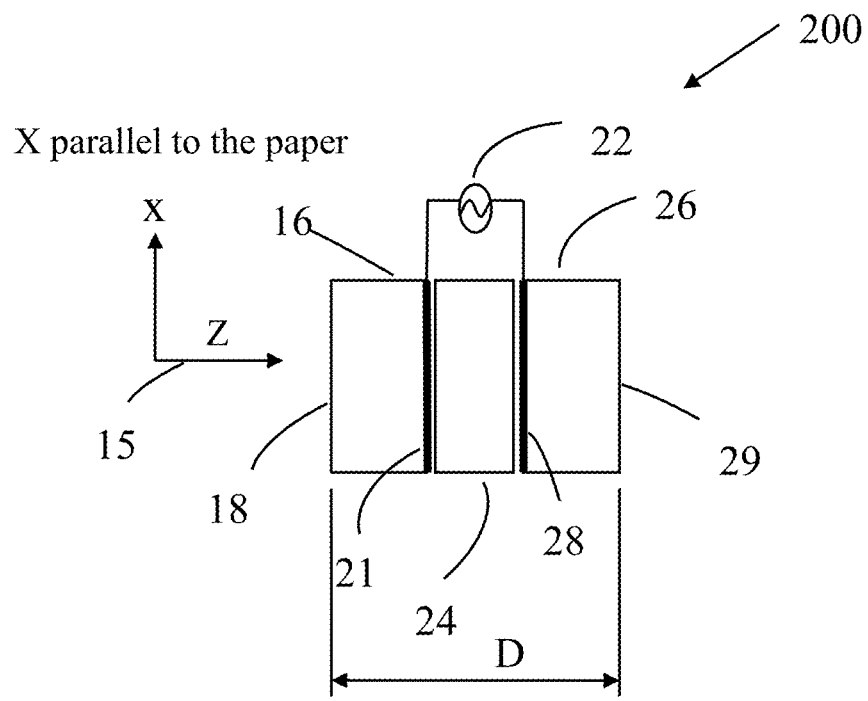
FIG. 5 is a schematic drawing of a tunable Fabry-Perot filter including a liquid crystal module.

FIG. 5 illustrates a tunable Fabry-Perot filter 200 utilizing an electro-optical effect of optical refractive index change of liquid crystal by an external electric field. The tunable Fabry-Perot filter 200 comprises two optical glass plates 16 and 26 with high reflective dielectric thin film of reflectivity R coated on the out surface 18 and 29 to form a Fabry-Perot cavity and a liquid crystal module 24; the internal surface of optical plates 16 and 26 are coated with anti-reflection thin films; the transparent electrodes 21 and 28 are arranged on the surface of the anti-reflection coatings; the control signal source 22 generates an electric field between the electrodes 21 and 28; the liquid crystal 24 is sandwiched between electrodes 21 and 28. Usually, a thin layer of liquid crystal of about 10 um is typically needed. The high free spectrum range (SR) of tunable Fabry-Perot filter can be achieved due to the thin layer of liquid crystal 24. The refractive index of the liquid crystal 24 can be changed by the applied electric field, and therefore, the transmission frequency peak v and free spectrum range (FSR) of the tunable Fabry-Perot filter 200 can also be changed by the applied electric field. Usually, a square electric waves from a few hertz to several kilo hertz of a few volts of amplitude is needed for such an application.

FIG. 5 shows a polarized light beam 15 with polarization direction along x axis propagating along z axis enters the tunable filter 200. Assuming the optical refractive index of the optical plates of 16 and 26 is n, the reflectivity of the thin film coatings of 18 and 26 is R, thickness is D, the FSR and transmission frequency can be expressed as $\Delta\lambda = \lambda^2/(2nD+\Gamma)$, or in frequency domain; $\Delta v = c/(2nD+\Gamma)$, where c is the speed of light, $\Gamma$ represents the additional optical path by the liquid crystal under the applied electric field. The transmission frequency peak can expressed as $v = mc/(2nD+\Gamma)$, where m is the order of interference, and transmission bandwidth (FWHM) can be express as $\Delta v$ (FWHM)$=c(1-R)/((2nD\pm\Gamma)R^{1/2})$, where c is the speed of light.

Figure 6:
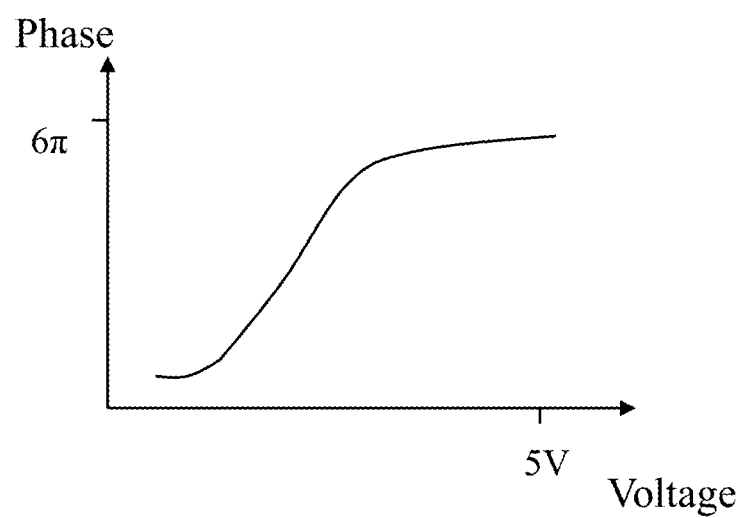
FIG. 6 is a schematic drawing of the relationship between the applied electric voltage and the optical phase of a liquid crystal module.

FIG. 6 shows the relationship between the applied electric field of 1 khz square wave and the optical phase change for light at wavelength 1550 nm. The maximum $6\pi$ optical phase change can be achieved. The tunable Fabry-Perot filter 200 can achieve about 1000 Hz frequency tuning range with less than 1 Ghz tuning accuracy. According the above formula, the change of free spectrum range $\Delta v$ and transmission bandwidth are much smaller.

Figure 8:
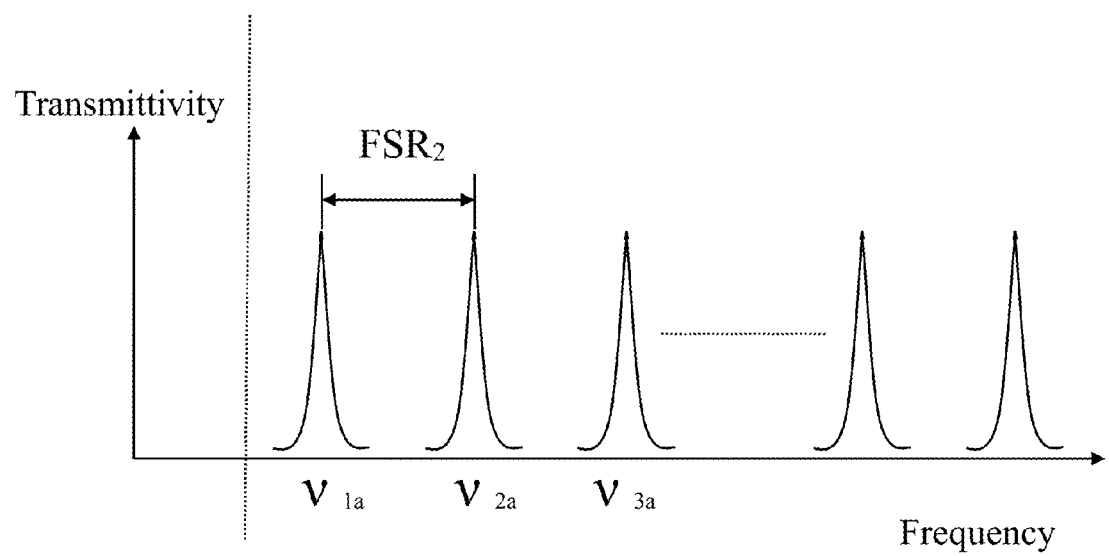
FIG. 8 is a schematic drawing of the output optical spectrum of the tunable Fabry-Perot filter.

FIG. 8 illustrates the transmission spectrum for tunable filter 200. The fact that tunable filter 200 can achieve large transmission frequency tuning without significantly changing the transmission frequency bandwidth and free spectrum range is important for application in this invention.

Further detailed description is made below to the embodiments of the invention with reference to the drawings.

Figure 9:
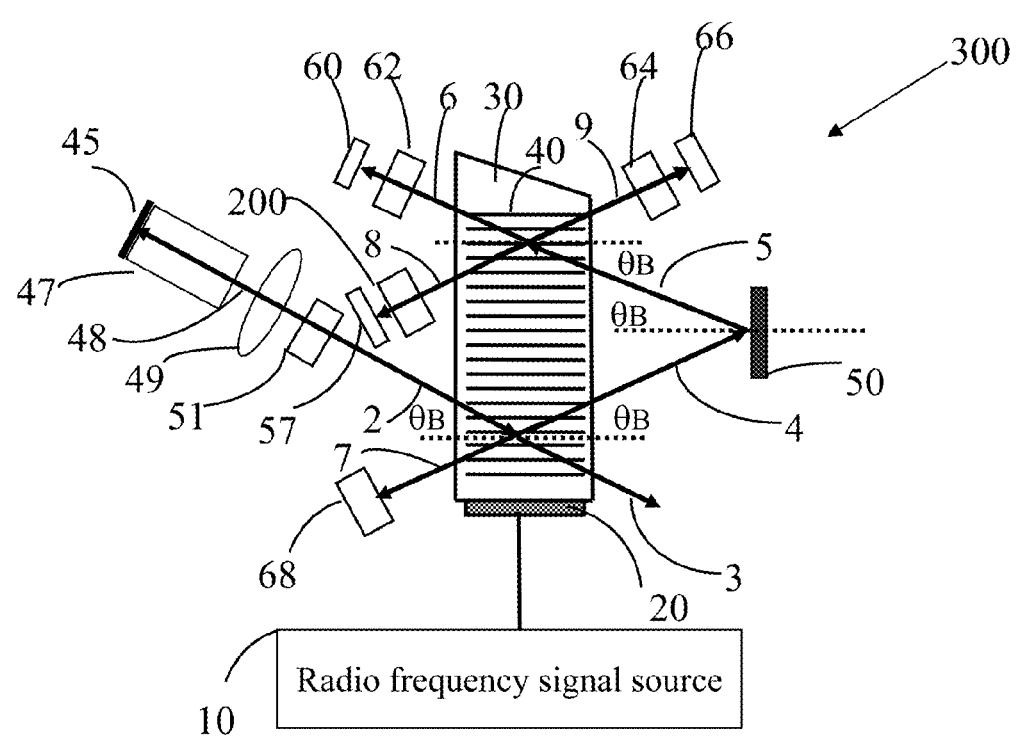
FIG. 9 is a schematic drawing of the tunable laser of the invention.

FIG. 9 shows the schematic diagram of a broad band continuous tunable laser 300. The tunable laser 300 comprises a laser gain medium 47, a first laser cavity mirror 45 directly coated on the gain medium 47, an intracavity collimating lens 49, an active optical phase modulator 51, an acousto-optic tunable filter shown in FIG. 1, an intracavity reflection mirror 50, a tunable Fabry-Perot filter 200, a second laser cavity mirror 57. The first laser cavity mirror 45, the intracavity mirror 50 and the second laser cavity mirror 57 forms the laser cavity. The tunable Fabry-Perot filter 200 is arranged in the optical path of the first order diffracted beam of the second diffraction by the acousto-optic tunable filter, the second laser cavity mirror 57 is arranged behind the tunable Fabry-Perot filter 200. The first laser cavity mirror 45, the laser gain medium 47, the intracavity collimating lens 49, the active optical phase modulator 51, the tunable Fabry-Perot filter 200, and intracavity reflection mirror are arranged in such a way that only the first order diffracted light of the first and second diffraction can be oscillated inside the laser cavity.

Laser cavity mirror differs in reflectivity for light with different frequencies or colors, and the reflectivity mentioned herein means a reflectivity corresponding to the frequency bandwidth of an operating laser. The first laser cavity mirror 45 can be either a partial reflection mirror or a total reflection mirror according to different situations. When the laser gain medium is a semiconductor gain medium that has a relatively large output divergent angle, the intracavity collimating lens 49 of the tunable laser 300 is normally used. When the laser gain medium is gas, liquid or some solid media, the intracavity collimating lens is not often used, instead, a non-planar cavity mirror is used to achieve a reasonable distribution of intracavity light beams. When such lasers are used for fiber optical communication, an output light beam 3 needs to be coupled to an optical fiber, so the collimating lens 49 is indispensable.

In the tunable laser 300, the laser gain medium 47 emits broad band fluorescence light 48, which is then collimated by the intracavity collimating lens 49 to become light beam 2. The collimated light beam 2 enters the acousto-optic crystal 30 of the acousto-optic tunable filter at Bragg angle after passed through the active optical phase modulator 51 to generate the first diffracted light beam 4, which is reflected by the intracavity reflection mirror 50 back to the acousto-optic crystal 30 at Bragg angle for a second diffraction. The first order diffracted light beam 8 of the second diffraction passes through the tunable Fabry-Perot filter 200, and then is reflected back by the second laser cavity mirror 57 to the laser cavity, and generates the oscillation and amplification inside the laser cavity. In this process, the zero-order diffracted beam 3, 6, 7 and 9 leak out of the laser cavity. The light beam 3 with zero frequency shift can be used as laser output for its maximum energy in the lasing oscillation and amplification process. Light beam 6,7 and 9 can be used for monitoring laser output power and wavelength. The detailed analysis for such applications is provided below.

As previously analyzed, optical frequency shifts generated by the first diffraction and the second diffraction are equal, but opposite to each other, so the overall optical frequency shift caused by the tunable acousto-optic filter inside tunable laser 300 cavity is zero. Laser oscillation bandwidth that is also narrower than a single diffraction is formed in the laser cavity due to the second diffraction by the tunable acousto-optic filter.

Different types of the intracavity reflection mirror 50 and the second laser cavity mirror 57 can be used to form different types of the laser cavity, to compensate the optical dispersion and divergence inside the laser cavity caused by the acousto-optic tunable lifter, and to reduce the laser cavity loss. Some reflective grating or other dispersive mirror can also used as the intracavity reflection mirror 50 for further reducing the lasing oscillation bandwidth. In the mean time, the laser cavity loss can be changed by changing the distance L between the intracavity mirror 50 and the acousto-optic crystal 30.

Laser output frequency tuning is realized via the active optical phase modulator 51, the acousto-optic tunable filter, and the tunable Fabry-Perot filter 200, The light wave resonant frequency in the laser cavity can be changed by changing the RF frequency of the radio frequency (RF) signal source 10 for the tunable acousto-optic filter, in accordance with different light wave resonant frequencies, the active optical phase modulator 51 enables a particular light wave to form laser oscillation and amplification in the laser cavity by regulating the phase of the light wave. If no electric voltage is applied, the tunable Fabry-Perot filter 200 works the same way as an etalon. The output frequency of the tunable laser 300 is limited by the tunable Fabry-Perot filter 200, i.e., the output frequency of the tunable laser 300 can only be tuned to the one of the transmission frequency of the tunable Fabry-Perot filter 200. The output frequency of the tunable laser can be precisely tuned by changing the voltage applied to the tunable Fabry-Perot filter 200. In this tuning process, the active optical phase modulator 51 and the RF frequency of the radio frequency signal source 10 should also be fined tuned. The broad band tuning can be realized for the tunable laser 300 due to the fact that the active optical phase modulator 51, the acousto-optic tunable filter, and the tunable Fabry-Perot filter 200 have broad band spectrum characteristics.

For example, when the eigen free spectrum range (FSR) of the tunable Fabry-Perot filter 200, i.e., the FSR without externally applied voltage to the tunable Fabry-Perot filter 200, equals to the ITU (International Telecom Union) 100 GHz in the DWDM system, the output frequency of tunable laser 300 can meet such ITU frequency grid by adjusting the active optical phase modulator 51, and RF frequency of the radio frequency signal source 10 applied to the acousto-optic tunable filter. As previously analyzed, the tunable Fabry-Perot filter 200 can achieve 100 GHz tuning range when proper external electric voltage is applied. Therefore, the tunable laser 300 can achieve continuous tuning within a broad band spectrum range, and the frequency tuning precision of about 1 Ghz can be achieved. In the modern fiber optic telecom industry, optical spectrum of C band (range about 1530 nm~1570 nm), or L band (range about 1570 nm~1610 nm) is commonly used with about 40 nm range in each band. The tunable laser 300 is capable of continuous frequency tuning in these two bands.

The output bandwidth (FWHM) of the tunable laser 300 is also determined by the tunable Fabry-Perot filter 200. The high finesse of tunable Fabry-Perot filter 200 will reduce the output bandwidth and increase the side mode suppression ratio of the tunable laser 300. Due to the fact that the effect of tuning on the bandwidth of the transmission frequency of the tunable Fabry-Perot filter 200 can be neglected, the output bandwidth of the tunable laser 300 can maintain approximately the same.

In general, in order to obtain the single laser mode output from the tunable laser 300, the bandwidth (FWHM) of the lasing mode without tunable Fabry-Perot filter 200 is less than the eigen free spectrum range (FSR) of the Fabry-Perot filter 200. In such condition, tunable laser 300 can maintain the single mode operation during the tuning within the whole working spectrum range because the effect of tuning process on the FSR of the tunable Fabry-Perot filter 200 can be also be neglected. Due to aging or other factors, the mode hoping, i.e., the lasing mode is switched from current mode to a neighboring mode or a more distance mode, can happen. The output power and output frequency shift (small output frequency change without mode hoping) can also occur. In order to keep the laser 300 under stable operation condition, it is necessary to monitor the above mentioned three parameters: lasing mode, optical frequency and power during the laser operation.

The realization of the lasing oscillation mode locking

The lasing mode locking and optical frequency monitoring in tunable laser 300 are realized by setting up a low finesse etalon Fabry-Perot etalon 62 and 64 in the optical path of light beams 6 and 9 shown in FIG. 9, and the photo detectors 60 and 66 respectively. The transmission spectrum of a low finesse etalon can be approximately treated as sine-shaped. FIGS. 10 and 11 illustrate the diagrams of the transmission spectrum of etalon 62 and 64 respectively with different finesse. Assuming that the eigen free spectrum range (the free spectrum range without applied voltage) of the tunable Fabry-Perot filter 200 is $FSR_1$, the free spectrum range of Fabry-Perot etalon 62 is four times the $FSR_1$ and the first transmission peak $v_1$ of Fabry-Perot etalon 62 is the same as that of tunable Fabry-Perot filter 200. Further assuming that the free spectrum range of Fabry-Perot etalon 64 is also four times the $FSR_1$ and the first transmission peak $v_1$ of Fabry-Perot etalon 64 is the same as the second transmission peak $v_2$ of tunable Fabry-Perot filter 200. In other words, the difference of the transmission peaks of Fabry-Perot etalon 62 and 64 is equal to one quarter of $FSR_1$. The power received by photo detector 60 and 66 are different for the transmitted light beams with different optical frequencies. Assuming that the maximum, minimum and medium optical power is 1, 0 and 0.5 respectively after normalization, the optical power received by photo detector 60 and 66 is summarized in the following table:

| Optical frequency | Optical power received by photo Detector 60 | Optical power received by photo detector 66 |
| --- | --- | --- |
| $v_1$ | 1 | 0.5 |
| $v_2$ | 0.5 | 1 |
| $v_3$ | 0 | 0.5 |
| $v_4$ | 0.5 | 0 |
| $v_5$ | 1 | 0.5 |
| $v_6$ | 0.5 | 1 |
| $v_7$ | 0 | 0.5 |
| $v_8$ | 0.5 | 0 |
| $v_9$ | 1 | 0.5 |
| $v_{10}$ | 0.5 | 1 |

Note that only the first ten optical frequencies are listed. From the above table, its obvious that the optical power received by photo detector 60 and 66 has the periodic characteristics. By comparing the optical power received by detector 60 and 66, it is possible to differentiate the optical frequency $v_1$ from $v_2$, $v_3$, $v_4$, $v_6$, $v_7$, $v_8$; $v_2$ from $v_1$, $v_3$, $v_4$, $v_5$, $v_7$, $v_8$, $v_9$. The optical powers received by photo detector 60 for $v_1$, $v_5$, $v_9$ and the optical powers received by photo detector 66 for $v_2$, $v_6$, $v_{10}$ are the periodically same. The same analysis can be applied to other optical frequencies. A lookup table in a digital signal processor for the corresponding optical power of each optical frequency (or optical mode) can be created for tunable laser 300 during the calibration such that the tunable laser 300 is capable of detecting the lasing mode hopping, and locking the lasing mode by the laser drive and control circuit system. It is noted that the tunable laser 300 is not capable of detecting the mode hopping from $v_1$ to $v_5$ or $v_9$; or from $v_2$ to $v_6$ or $v_{10}$ due to the periodic characteristics as analyzed above. The same analysis can also made to other lasing modes. Therefore, the tunable laser 300 is only capable of detecting the mode hopping from its operation mode to the modes not on its periodic modes or more accurately, from its operation modes to the three neighboring modes above (the higher optical frequency) and below (the lower optical frequency) the operation modes. Generally, the most frequent mode hopping in a laser system takes place from its operation modes to its neighboring modes.

In the mode locking process of tunable laser 300, the operation mode can be pulled back by changing the radio frequency of the driving signal applied to the tunable acousto-optical tunable filter or other laser driving parameters when mode hopping has taken place. It is necessary for tunable laser 300 to not only detect the mode hopping, but also judge the direction of mode hopping. Taking $v_5$ as an operation mode in the above table for example, the tunable laser 300 is only capable of differentiating the mode $v_4$ and $v_6$, and not $v_6$ and $v_7$, therefore, the tunable laser 300 is capable of locking an operation mode only when the mode is hopped to its neighboring four modes. It is necessary to add more devices and change the free spectrum range of the Fabry-Perot etalons to achieve more powerful mode locking. For example, it is possible for tunable laser 300 to lock an operation mode when the mode is hopped to its neighboring six modes by adding a third photo detector and a third etalon to its existing mode lock system, which has the free spectrum range of eight times the $FSR_1$ and the transmission peak is offset by two times the $FSR_1$.

The realization of laser optical frequency locking

The optical frequency of a tunable laser may shift over time without mode hopping due to aging or other factors. Generally, the optical frequency shift can be defined by the optical frequency change less than half of the frequency span between two neighboring modes for example: frequency shift $<0.5(v_2-v_1)$. As illustrated in FIG. 11, the optical frequency shift will affect the optical power after passing through the Fabry-Perot etalon 62 and 64, hence, the optical power received by photo detector 60 and 66. Therefore, the power change information which is related to the optical frequency change can be used for locking the optical frequency by changing the laser cavity temperature, optical phase and radio signal frequency, etc. From FIG. 11, it can be seen that the odd modes $v_1$, $v_3$, $v_5$ and $v_7$ etc. are located in the middle of the lower transmission curve, and even modes $v_2$, $v_4$, $v_6$ and $v_8$ etc. are located in the middle of the upper transmission curve where the optical frequency vs power change is approximately linear. The optical frequency change of the odd and even modes can be respectively detected by photo detector 66 and 60. The optical frequency can be locked through the feedback loop of the drive and control circuit system of tunable laser 300.

The realization of laser optical power locking

The photo detector 68 in FIG. 9 is used for directly monitoring the lasing power for tunable laser 300. The lasing power can be locked by changing the laser pumping power or other parameters through the feedback loop of the drive and control circuit system.

Figure 12:
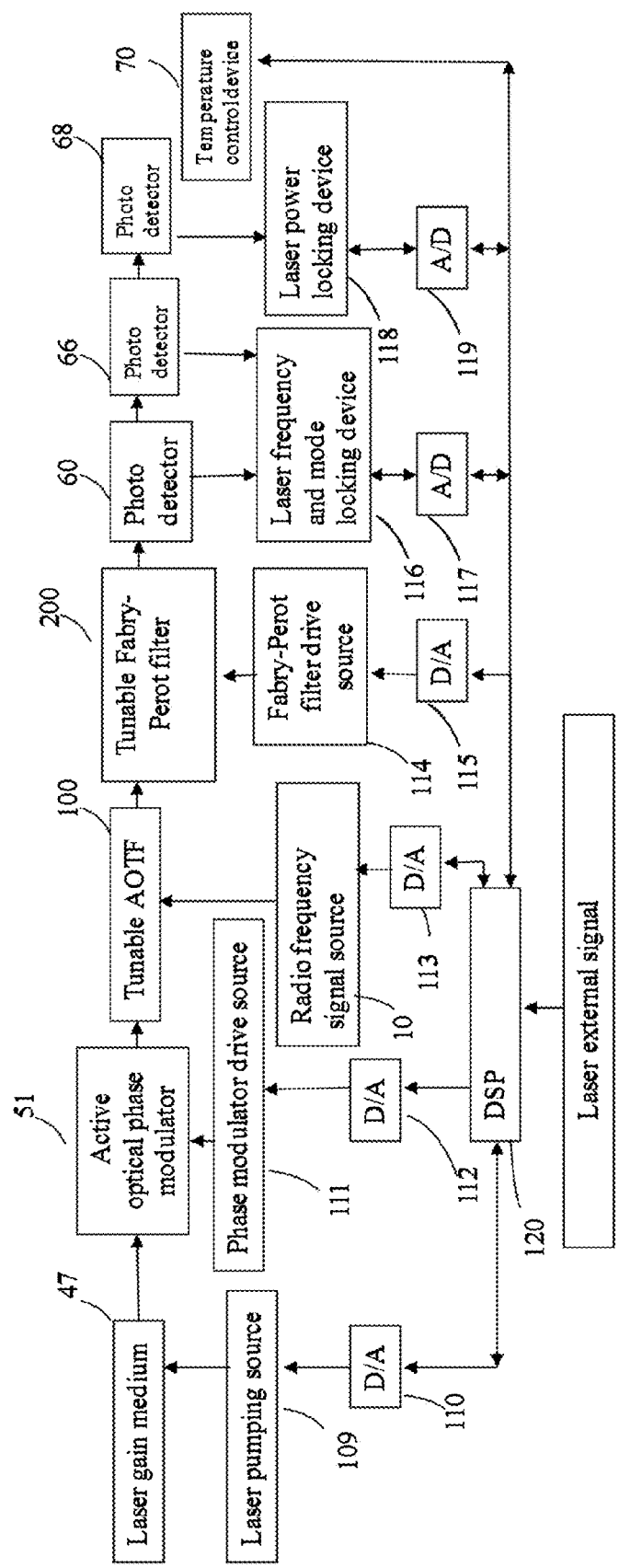
FIG. 12 is a schematic drawing of the a functional block diagram of the laser drive and control circuit system.

FIG. 12 is a schematic diagram of the drive and control circuit system for tunable laser 300. The digital signal processor (DSP) 120 with embedded software programs is used for controlling the laser pumping source 109, the active optical phase modulator drive source 111, the radio frequency signal source 10 for the tunable acousto-optic filter, and driving source 114 for tunable Fabry-Perot filter through the digital-to-analog conversion (D/A) devices 110, 112, 113 and 115 respectively.

DSP 120 is also used to drive and control laser optical frequency and mode locking devices 116 and laser optical power locking devices 118 through two analog-to-digital conversion (A/D) devices 117 and 119 respectively, and directly control the temperature control device 70. The digital signal processor (DSP) 120 may also receive an external instruction to control the laser 300 for all operation related functions.

The above description is for demonstration and description only, not a detailed one without omission, and is not intended to limit the invention within the described specific forms. With the aforementioned description, many modifications and variations to the invention are possible. The chosen embodiments are merely for better explanation of the principle and practical applications of the invention. This description enables people familiar with this art to make better use oil the invention, and to design different embodiments based on the actual needs and implement corresponding modifications.

I claim:

1. A broad band continuous tunable laser comprising a first laser cavity mirror, a laser gain medium, an intracavity collimating lens, an active optical phase modulator, one tunable acousto-optic filter, an intracavity reflection mirror, a tunable Fabry-Perot filter, a second laser cavity mirror and a laser drive and control circuit system;

the tunable acousto-optic filter consists of a single acousto-optic crystal, a single acoustic wave transducer bonded on a selected surface of the acousto-optic crystal and a radio frequency signal source;

the tunable Fabry-Perot filter includes a first reflection mirror, a liquid crystal module, and a second reflection mirror; the first reflection mirror, and the second reflection mirror forms a Fabry-Perot cavity, the liquid crystal module is arranged inside the Fabry-Perot cavity;

the intracavity collimating lens collimates the light beam outputted from the laser gain medium and inputs the collimated beam into the tunable acousto-optical filter at Bragg angle to generate the first diffraction after passing through the active optical phase modulator;

the intracavity mirror is arranged on the opposite side of the acousto-optic filter from the laser gain medium to reflect the first order diffracted beam of the first diffraction by the tunable acousto-optic filter at the Bragg angle back to the tunable acousto-optic filter for second diffraction to compensate the optical frequency shift caused by the first diffraction;

the tunable Fabry-Perot filter is arranged on the opposite side of the acousto-optic filter from the intracavity reflection mirror and in the optical path of the first order diffracted beam of the second diffraction by the tunable acousto-optic filter, the second laser cavity mirror is arranged on the opposite side of the acousto-optic filter from the intracavity reflection mirror and behind the tunable Fabry-Perot filter;

the first laser cavity mirror, the intracavity reflection mirror and the second laser cavity mirror forms the laser cavity;

the first laser cavity mirror, the laser gain medium, the intracavity collimating lens, the active optical phase modulator, the tunable acousto-optical filter, the intracavity reflection mirror, the tunable Fabry-Perot filter and the second laser cavity mirror are arranged in such a way that only the first order diffracted beams of the first diffraction and the second diffraction can be oscillated in the laser cavity;

the laser output beam is in the same optical axis of the first order diffracted beam of the first diffraction.

2. The broad band continuous tunable laser of claim 1, wherein the first laser cavity mirror, the second laser cavity mirror and the intracavity reflection mirror are one of the following types of reflection mirrors: plane mirror, convex mirror and concave mirror with equal to or less than 100% reflectivity, and have the same spectrum range as the laser gain medium; the first laser cavity mirror can be a multilayer dielectric thin film coated directed on the laser gain medium; the intracavity reflection mirror can be reflective optical grating or other optical dispersive mirror.

3. The broad band continuous tunable laser of claim 1, wherein the laser gain medium is a broad band laser gain medium.

4. The broad band continuous tunable laser of claim 1, wherein the active optical phase modulator is one of the following types: opto-electric, acusto-optic, and opto-magnetic optical phase modulator or the combination of the above optical phase modulators.

5. The broad band continuous tunable laser of claim 1, wherein the out surface of the first reflection mirror is coated with high reflection thin film; internal surface of the first reflection mirror is coated with anti-reflection thin film and transparent electrode; the internal surface of the second reflection mirror is coated with transparent electrode and anti-reflection thin film; out surface of the second reflection mirror is coated with high reflection thin film.

6. The broad band continuous tunable laser of claim 1, wherein the liquid crystal is nematic type, and the thickness of the liquid crystal layer is from a few um to thicker than 10 um, and exhibits more than $2\pi$ optical phase change for a polarized light beam with certain orientation by an external electric signal, and has the same spectrum range as the laser gain medium.

7. The broad band continuous tunable laser of claim 1, further comprising a laser frequency and oscillation mode locking device, wherein the laser frequency and oscillation mode locking device comprises a first Fabry-Perot etalon, a first photo detector, a second Fabry-Perot etalon and a second photo detector; the first Fabry-Perot etalon is arranged outside of the laser cavity and in the optical path of the zero-order diffracted light beam of the second diffraction by the acousto-optic filter; the first photo detector is arranged behind the first Fabry-Perot etalon to detect the light beam power transmitted from the first Fabry-Perot etalon; the second Fabry-Perot etalon is arranged outside the laser cavity and in the optical path of zero-order diffracted light beam of the light beam reflected by the second laser cavity mirror and diffracted by the acousto-optical tunable filter; the second photo detector is arranged behind the second Fabry-Perot etalon to detect the light beam power transmitted from the second Fabry-Perot etalon.

8. The broad band continuous tunable laser of claim 7, wherein the first Fabry-Perot etalon has the same optical spectrum range as the laser gain medium; the maximum and minimum transmitted optical power difference of the first Fabry-Perot etalon is equal to or larger than 3 dB by setting up the proper finesse; the free spectrum range of the first Fabry-Perot etalon is four times that of the tunable Fabry-Perot filter without external electric voltage; one of the transmission frequency peak of the Fabry-Perot etalon is the same as that of the tunable Fabry-Perot filter.

9. The broad band continuous tunable laser of claim 7, wherein the second Fabry-Perot etalon has the same optical spectrum range as the laser gain medium, and same finesse and free spectrum range as that of the first Fabry-Perot etalon; the difference of the transmission frequency peak between the first and second Fabry-Perot etalon is equal to the free spectrum range of the tunable Fabry-Perot filter without external electric voltage.

10. The broad band continuous tunable laser of claim 1, further comprising a laser power locking device, wherein the laser power locking device comprises a photo detector arranged outside the laser cavity and in the optical path of zero-order diffracted light beam of the second diffraction of the light beam reflected by the second laser cavity mirror and diffracted by the acousto-optic filter.

11. The broad band continuous tunable laser of claim 1, wherein the laser drive and control circuit includes a digital signal processor with embedded software program, a laser pumping source, an active optical phase modulator drive source, a radio frequency signal source for the tunable acousto-optic filter, a driving source for the tunable Fabry-Perot filter, two analog-to-digital conversion devices, four digital-to-analog conversion devices and a temperature control device, the digital signal processor with embedded software programs is used for controlling the laser pumping source, the active optical phase modulator drive source, the radio frequency signal source, and the driving source for the tunable Fabry-Perot filter through the digital-to-analog conversion devices; the digital signal processor with embedded software programs is also used to drive and control the temperature control device, and drive and control the laser optical frequency and mode locking device and the laser optical power locking devices through the analog-to-digital conversion devices; the digital signal processor may also receive an external instruction to control the broad band continuous tunable laser for all operation related functions.

* * * * *